United States Patent [19]

Kamiya

[11] 4,086,542
[45] Apr. 25, 1978

[54] COMPLEMENTARY PUSH-PULL AMPLIFIER

[75] Inventor: Shingo Kamiya, Hamamatsu, Japan

[73] Assignee: Nippon Gakki Seizo Kabushiki Kaisha, Hamamatsu, Japan

[21] Appl. No.: 767,484

[22] Filed: Feb. 10, 1977

[30] Foreign Application Priority Data

Feb. 12, 1976 Japan .............................. 51-14087[U]

[51] Int. Cl.² .............................................. H03F 3/183
[52] U.S. Cl. ..................................... 330/268; 330/265
[58] Field of Search ....................... 330/13, 17, 22, 25, 330/28, 40; 179/1 A; 307/313

[56] References Cited

U.S. PATENT DOCUMENTS

| 2,782,267 | 2/1957 | Beck | 330/13 |
| 3,537,023 | 10/1970 | Myer | 330/15 X |
| 3,683,293 | 8/1972 | Matsui | 330/29 X |
| 3,968,450 | 7/1976 | Suzuki et al. | 330/13 X |

OTHER PUBLICATIONS

*Basic Theory and Application of Transistors*, Technical Manual No. 11-690, Mar. 17, 1959, pp. 88-90.

*Primary Examiner*—James B. Mullins
*Attorney, Agent, or Firm*—Cushman, Darby & Cushman

[57] ABSTRACT

A complementary push-pull amplifier comprising a pair of complementary transistors each of which is connected to a voltage source through a relatively large resistance and having the base biased with a voltage formed from the emitter-collector voltage of the transistor. Means for equalizing the amplitudes of second order distortion caused by the respective transistors is provided in a portion of the circuit other than the emitter circuit. The collector current is stabilized by the relatively large resistance connected to the collector and the asymmetry of the pair of transistors can be corrected by the amplitude equalizing means for cancellation of the second order distortion.

11 Claims, 9 Drawing Figures

4,086,542

COMPLEMENTARY PUSH-PULL AMPLIFIER

BACKGROUND OF THE INVENTION (a) Field of the Invention

This invention relates to a push-pull type transistor amplifier using complementary transistors and more particularly to an improvement of the signal-to-noise (S/N) ratio and the distortion factor as well as the stability of bias.

(b) Description of the Prior Art

FIG. 1 shows the bias circuit which is conventionally adopted in a complementary push-pull amplifier, wherein the bias voltage sources $+E_C$ and $-E_C$ are connected to the respective bases of complementary transistors $Tr1$ (NPN type, for example) and $Tr2$ (PNP type, for example). Transistors $Tr1$ and $Tr2$ are connected in push-pull manner between supply voltage sources $+E_B$ and $-E_B$. Stabilizing resistors $Re1$ and $Re2$ are inserted in the emitter circuit of the transistors $Tr1$ and $Tr2$ in order to improve the stability of the operating points of the transistors $Tr1$ and $Tr2$, i.e., the stability of collector current against the change in ambient temperature. In such a conventional bias circuit, however the insertion of the stabilizing resistors $Re1$ and $Re2$ causes the deterioration of the S/N ratio of the amplifier because of the thermal noise produced therein.

SUMMARY OF THE INVENTION

In view of the afore-described problems, an object of this invention is to provide a complementary push-pull amplifier capable of stabilizing the idling or bias current through transistors against such changes of external conditions as ambient temperature, etc., without inserting any stabilizing resistors in the emitter circuit of the transistors thereby preventing the deterioration of the S/N ratio caused by thermal noises in the stabilizing resistors. It is another object of the invention to provide a complementary push-pull amplifier capable of easily preventing the creation of second order or quadratic distortion due to the asymmetry of transistors without causing deterioration of the S/N ratio.

According to an aspect of this invention, there is provided a complementary push-pull amplifier in which a resistor is connected in series to each collector circuit of the pair of complementary push-pull transistors for dropping the supply voltage to a considerable extent. Voltage divider means is connected between the emitter and the collector of each of the transistors for supplying the bias voltage between the base and the emitter of said transistors. There may be further provided means for equalizing the amplitudes of the second order distortion contained in output signals of the complementary pair transistors thereby cancelling such distortion.

Other objects, features and advantages of this invention will become apparent from the following description of the preferred embodiments when taken in conjunction with the accompanying drawings.

DESCRIPTION OF THE PREFERRED EMBODIMENTS

Figure 1:
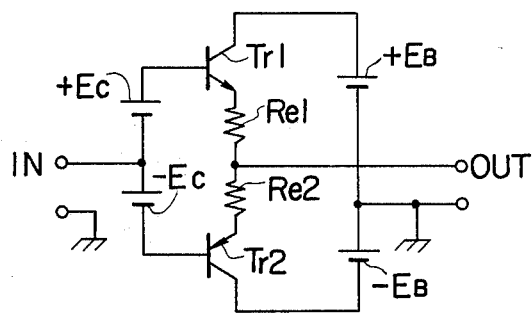
FIG. 1 is an electric circuit diagram of a conventional amplifier circuit.
Figure 2:
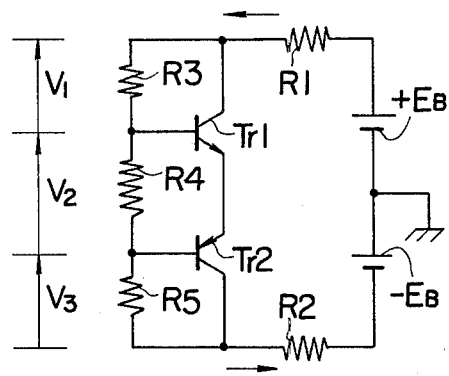
FIG. 2 is a fundamental electric circuit diagram of the amplifier of this invention.

FIG. 2 shows the principle of the amplifier of this invention, where resistors R1 and R2 are connected in series to a pair of complementary push-pull transistors $Tr1$ and $Tr2$ between positive and negative supply voltage sources $+E_B$ and $-E_B$ having a grounded interconnection point. The resistance values of the resistors R1 and R2 are generally selected to be equal in order to attain the symmetry of the potentials across the respective transistors $Tr1$ and $Tr2$. A series resistance circuit (voltage divider) consisting of resistors R3, R4, and R5 is connected in parallel to the transistors $Tr1$ and $Tr2$. The bias voltage between the base and the emitter of each of said transistors is supplied by this voltage divider. Generally, the current level flowing through said voltage divider is selected to be much larger than that of the base current of the transistors $Tr1$ and $Tr2$. The resistance values of the resistors R1 and R2 are so determined that each voltage drop therein occupies a considerable portion of the supply voltage. To aid comprehension, specific values will be given to the respective resistors in the following description.

Assuming that each value of the resistors R1 and R2 is 5kΩ, each value of the resistors R3 and R5 is 2kΩ and the value of the resistor R4 is 4kΩ, if the voltage between the base and the emitter of each of the transistors $Tr1$ and $Tr2$ is 0.6V, the voltage $V_2$ across the resistor R4 becomes 1.2V. As the current flowing in resistors R3, R4 and R5 can be regarded as equal, the voltages $V_1$ and $V_3$ across the resistors R3 and R5 become 0.6V, respectively. If the supply voltages $+E_B$ and $-E_B$ are +30V and -30V, respectively, larger part of the supply voltage is consumed in the resistors R1 and R2 and the collector current through the transistors $Tr1$ and $Tr2$ becomes $(60V - 2.4V)/10kΩ = 5.76mA$. Thus, it would be understood that even if the forward voltage between the base and the emitter of each of the transistors $Tr1$ and $Tr2$ is varied with the change in the ambient temperature and other factors, the collector current through the transistors $Tr1$ and $Tr2$ remains almost constant at a level determined by the supply voltage and the resistances R1 and R2 regardless of the change in the voltage $(V_1 + V_2 + V_3)$. The resistors R1 and R2 yield a voltage drop of $(60V - 2.4V) = 57.6V$ in the above example. When the voltage between the base and the collector of each of the transistors $Tr1$ and $Tr2$ should be kept higher than 0.6V, the values of the resistors R1 and R2 may be reduced and/or the values of the resistors R3, R4, and R5 may be changed properly. It will be understood that the stability of the collector current against the changes in temperature and other factors is improved with the increase in the ratio of the voltage drop in the resistors R1 and R2. Thus, the collector current through the transistors becomes very stable against the changes in ambient temperature and operation conditions. The S/N ratio is also improved because no stabilizing resistor is inserted in the emitter circuits of transistors. In addition, there may be provided means for equalizing the amplitudes of the second order distortion brought about by the respective transistors and compensating for the asymmetry of the transistors, in other part than the emitter circuits of the pair of complementary push-pull transistors. Then, the second order distortion can be cancelled. As examples of such means, either one or both of the resistors R1 and R2 in the collector circuits of the transistors $Tr1$ and $Tr2$ may be replaced with a variable resistor or resistors. Here, a combination of a fixed resistor and a variable resistor can, of course, be used as a composite variable resistor. Alternatively, one or both of the voltage supply sources $+E_B$ and $-E_B$ may be arranged variable, or either one or both of the resistors R3 and R5 in the bias circuits may be replaced with variable resistor or resistors. The adjustment of the collector current through the transistors Tr1, transistor Tr2, or both by such means enables the equalization of the gains of the transistors Tr1 and Tr2 to eliminate the second order distortion. For the purpose of the cancellation of the second order distortion, it is also advantageous to provide means for adjusting the ratio of the load resistors of the pair of transistors Tr1 and Tr2 or to provide means for adjusting the mixture ratio of the AC outputs of those transistors. Furthermore, such adjustment means is installed in other part than the emitter circuit to prevent the deterioration of the S/N ratio.

Hereinbelow, description will be made on embodiments of the common emitter type amplifier circuits. Throughout the embodiments, similar reference marks denote similar parts.

Figure 3:
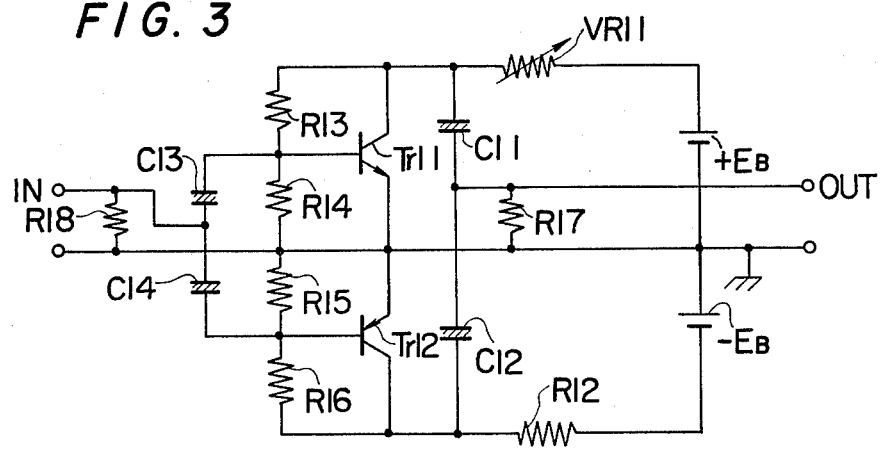
FIGS. 3 to 9 are electric circuit diagrams of amplifiers according to various embodiments of this invention.

FIG. 3 shows a first embodiment of this invention in which the emitters of PNP-type and NPN-type transistors Tr11 and Tr12 are connected in common and grounded, and the collectors thereof are connected through a variable resistor VR11 and a resistor R12 with positive and negative supply voltage sources $+E_B$ and $-E_B$ having the grounded interconnection point. The variable resistor VR11 is an equivalent to the resistor R1 in FIG. 2 and serves also as means for adjusting the collector current as described above. The resistor R12 is an equivalent to the resistor R2 in FIG. 2. The voltage between the collector and the emitter of the respective transistors Tr11 and Tr12 is divided by resistors R13 and R14, and R15 and R16, and the divided voltages are applied to the bases of the transistors Tr11 and Tr12. The bases of transistors Tr11 and Tr12 are connected with the common input terminal IN through capacitors C13 and C14, respectively. The input terminal IN is grounded through a resistor R18. The output terminal OUT is drawn out from the collectors of the transistors Tr11 and Tr12 through respective capacitors C11 and C12 and is grounded through a resistor R17. This embodiment is similar to the basic circuit of FIG. 2 in the point of the stabilization of the bias current of the transistors Tr11 and Tr12. The variable resistor VR11 enables the adjustment of the collector current of the transistor Tr11 and thus equalizes the gains of the transistors Tr11 and Tr12, resulting in the minimization of the second order distortion due to the asymmetry of the transistors Tr11 and Tr12.

Figure 4:
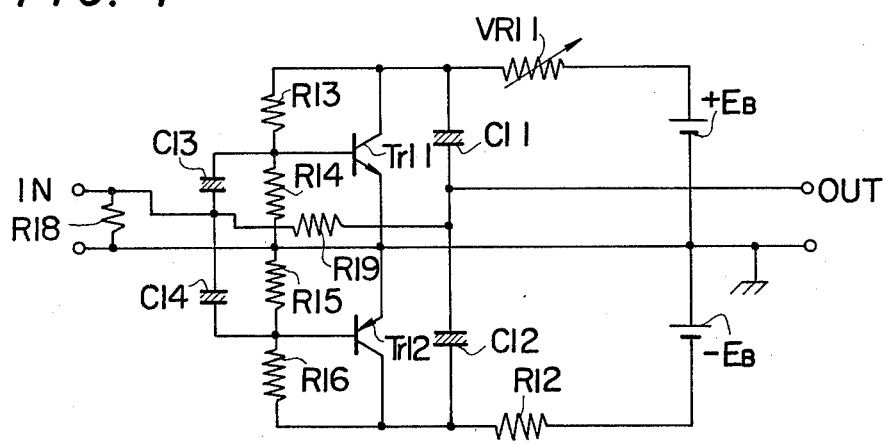

FIG. 4 shows a second embodiment, in which the output signal is negatively fed back to the bases of transistors Tr11 and Tr12 through a resistor R19. The rest of the circuit is similar to the circuit of FIG. 3.

Figure 5:
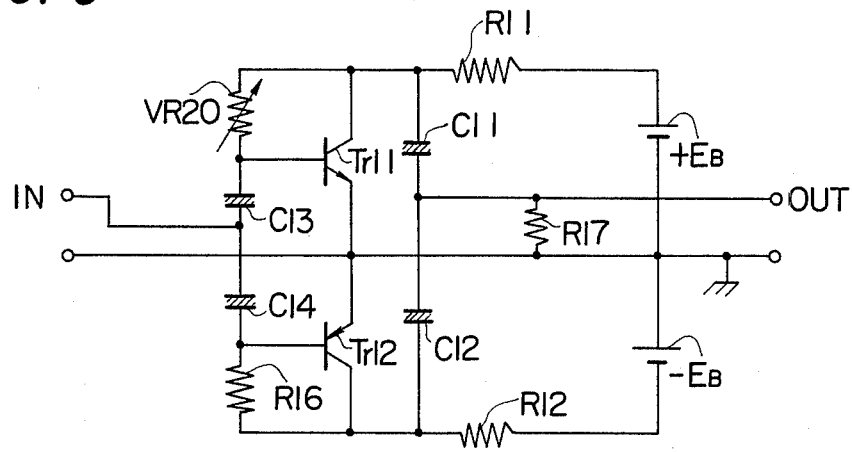

FIG. 5 shows another embodiment of this invention in which a variable resistor VR20 is connected between the collector and the base of a transistor Tr11 to adjust the collector current of the transistor Tr11 and fixed resistors R11 and R12 are used in the collector circuits of the transistors Tr11 and Tr12.

Figure 6:
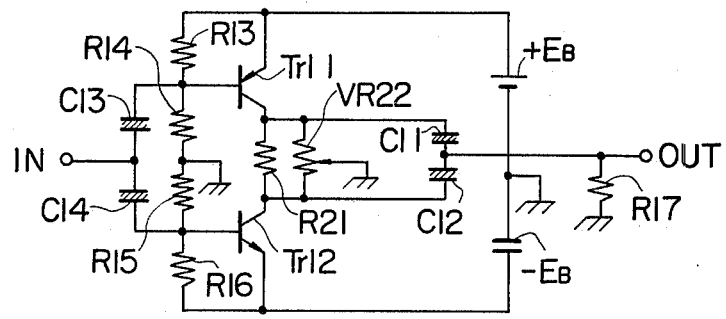

FIG. 6 shows another embodiment of this invention in which a potentiometer VR22 is used to adjust the collector currents of both transistors Tr11 and Tr12 at the same time. Namely, the emitters of the transistors Tr11 and Tr12 are directly connected with supply voltage sources $+E_B$ and $-E_B$, respectively, and the collectors of the transistors Tr11 and Tr12 are connected with each other through a resistor R21. The potentiometer VR22 is connected in parallel to the resistor R21 and the sliding contact of the potentiometer VR22 is grounded. Therefore, when the sliding contact is slided to the side of the transistor Tr11 from the midpoint, the collector current of transistor Tr11 increases and that of Tr12 decreases. In this way, by the operation of the potentiometer VR22, it is possible to increase the collector current of one transistor and to decrease that of the other at the same time. The deviation from the standard collector current can be comparatively small even when the degree of asymmetry of the transistors Tr11 and Tr12 is large.

Figure 7:
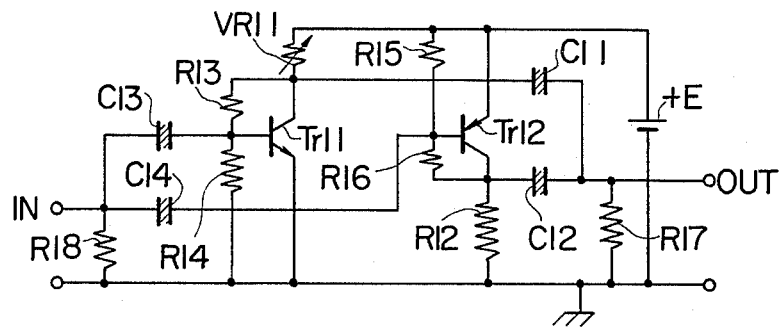

FIG. 7 shows another embodiment of this invention, which can be operated with one supply voltage source $+E_B$ only. The emitter of the transistor Tr11 is grounded and the collector thereof is connected with the supply voltage source $+E_B$ through a variable resistor VR11. The emitter of the other transistor Tr12 is directly connected with the supply voltage source $+E_B$ and the collector thereof is grounded through a resistor R12. The rest of the circuit is similar to other embodiments described above. Since the emitters of the transistors Tr11 and Tr12 are grounded directly and through the fixed voltage source $+E_B$, respectively, this embodiment is also a common emitter type push-pull amplifier.

Figure 8:
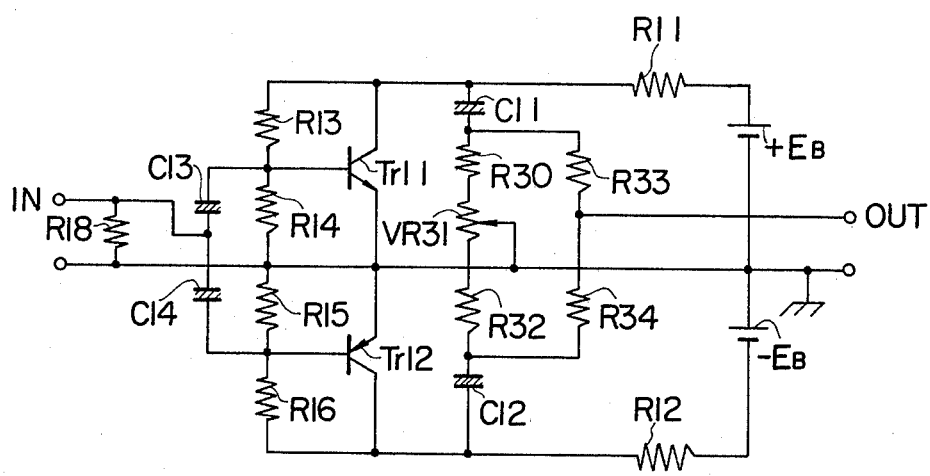

FIG. 8 shows another embodiment of the complementary push-pull amplifier circuit in which the output signal is extracted in a modified manner. Namely, resistors R30 and R32 and a potentionmeter VR31 are connected in series between the output extracting capacitors C11 and C12 of the circuit of FIG. 3 thereby constituting a DC load resistance to the transistors Tr11 and Tr12. The variable resistor VR11 in the circuit of FIG. 3 is replaced by a fixed resistor R11.

The sliding tap of the potentiometer VR31 is grounded and the output terminal OUT is connected with the capacitors C11 and C12 through respective resistors R33 and R34. By this arrangement, the ratio of the load resistance of the transistors Tr11 and Tr12 can be adjusted by changing the position of the sliding tap of the potentiometer VR31. Therefore, the gains of transistors Tr11 and Tr12 are equalized to cancel the second order distortion caused by the respective transistors. The rest of the circuit is similar to that of FIG. 3.

Figure 9:
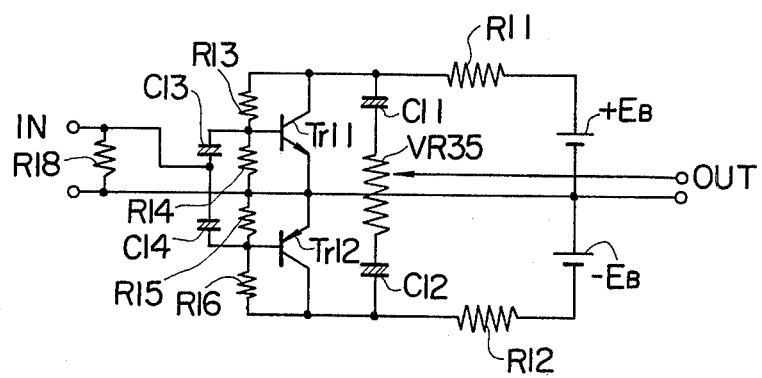

FIG. 9 shows another embodiment of the complementary push-pull amplifier circuit in which the output signal is extracted in a further modified manner. Namely, a potentiometer VR35 is connected in series between the output extracting capacitors C11 and C12 in the circuit of FIG. 8. This embodiment dispenses with the resistors R30 and R32 and potentiometer VR31 in FIG. 8 and the resistors R33 and R34 in FIG. 8 are replaced by the potentiometer VR35.

The sliding tap of the potentiometer VR35 is connected to the output terminal OUT. This arrangement also enables the adjustment of the mixture ratio of the AC outputs of transistors Tr11 and Tr12 by changing the position of the sliding tap of the potentiometer VR35 so that the second order distortion caused by the respective transistors is cancelled. The rest of the circuit is similar to that of FIG. 8.

As stated above, in the amplifier of this invention, resistance is inserted in the collector circuit of each of the complementary push-pull transistors to drop down a large part of the supply voltage, the bias circuit is so constructed that the bias voltage between the base and the emitter of each transistor is obtained from the voltage across the transistor, and means for equalizing the amplitudes of the second order distortion caused by the respective transistors is provided in other portion than the emitter circuit of each transistor. Accordingly, the stability of bias can be improved without inserting any stabilizing resistor in the emitter circuit which can become sources of thermal noises, better S/N ratio can be attained, and the creation of second order distortion due to the asymmetry of the transistors can be prevented to achieve a very low degree of distortion. The S/N ratio is not adversely affected by the means for equalizing the amplitudes of the second order distortion because such means or elements are provided in other parts than the emitter circuits of the transistors.

I claim:

1. A complementary push-pull amplifier circuit comprising:

a pair of complementary transistors each including base, collector and emitter and connected in push-pull relation;

an input circuit connected to the base of each of said pair of transistors;

an output circuit connected to the collector of each of said pair of transistors;

means for supplying a voltage to said pair of transistors;

a resistance connected in series with the collector circuit of said transistors for dropping down a large part of the supply voltage and applying a small part of said supply voltage across said transistors; and bias voltage circuit means connected to the electrodes of each transistor for dividing the voltage between the collector and the emitter of the transistor and establishing the base bias voltage between the base and the emitter of the transistor by said divided voltage, whereby the idling current through said transistors is substantially stabilized against changes in external conditions.

2. A complementary push-pull amplifier circuit according to claim 1, wherein said bias voltage circuit means comprises a pair of voltage dividers, each having the end terminals connected to the collector and the emitter of the transistor and the voltage dividing terminal connected to the base thereof.

3. A complementary push-pull amplifier circuit according to claim 1, wherein said resistance consists of two similar resistors each connected to the collector of each of said transistors.

4. A complementary push-pull amplifier circuit according to claim 1, further comprising means for equalizing amplitudes of second order distortion contained in output signals of said complementary pair of transistors, thereby cancelling said distortion.

5. A complementary push-pull amplifier according to claim 4, wherein said amplitude equalizing means comprises means for adjusting the collector current of at least one of said pair of transistors, said collector current adjusting means being disposed in other than the emitter circuits of said transistors.

6. A complementary push-pull amplifier circuit according to claim 5, wherein said collector current adjusting means is formed of a variable resistor which constitutes part of said resistance means.

7. A complementary push-pull amplifier circuit according to claim 5, wherein said collector current adjusting means comprises a variable resistor which constitutes part of said bias voltage circuit means.

8. A complementary push-pull amplifier according to claim 4, further comprising load resistance means for said pair of transistors included in said output circuit, said amplitude equalizing means being means for adjusting the ratio of the respective load resistances of said pair of transistors.

9. A complementary push-pull amplifier circuit according to claim 8, wherein said load resistance ratio adjusting means comprises a potentiometer having fixed terminals respectively connected to the collectors of said transistors through a capacitor, and a sliding terminal connected to the ground.

10. A complementary push-pull amplifier according to claim 4, wherein said amplitude equalizing means comprises means for adjusting the mixture ratio of outputs of said pair of transistors.

11. A complementary push-pull amplifier circuit according to claim 10, wherein said output mixture ratio adusting means comprises a potentiometer having fixed terminals respectively connected to the collectors of said transistors through a capacitor, and a sliding terminal connected to an output terminal of the amplifier circuit.

* * * * *

UNITED STATES PATENT OFFICE
CERTIFICATE OF CORRECTION

Patent No. 4,086,542　　　　　　　　Dated April 25, 1978

Inventor(s) Shingo Kamiya

It is certified that error appears in the above-identified patent and that said Letters Patent are hereby corrected as shown below:

Claim 6, line 4, delete "means".

Signed and Sealed this

Thirty-first Day of October 1978

[SEAL]

Attest:

RUTH C. MASON
Attesting Officer

DONALD W. BANNER
Commissioner of Patents and Trademarks